(12) United States Patent
Jou et al.

(10) Patent No.: US 7,599,160 B2
(45) Date of Patent: Oct. 6, 2009

(54) ELECTROSTATIC DISCHARGE PROTECTION CIRCUITS

(75) Inventors: Yeh-Ning Jou, Taipei County (TW);
Geeng-Lih Lin, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 11/946,011

(22) Filed: Nov. 27, 2007

(65) Prior Publication Data
US 2009/0135532 A1 May 28, 2009

(51) Int. Cl.
*H02H 9/00* (2006.01)
*H02H 1/00* (2006.01)
(52) U.S. Cl. ........................................ 361/56
(58) Field of Classification Search ................... 361/56
See application file for complete search history.

(56) References Cited
U.S. PATENT DOCUMENTS

| | | | |
|---|---|---|---|
| 6,144,542 A * | 11/2000 | Ker et al. ............... | 361/111 |
| 7,167,350 B2 * | 1/2007 | Salcedo-Suner et al. ...... | 361/56 |
| 7,372,109 B2 * | 5/2008 | Chen et al. ............... | 257/370 |
| 7,408,752 B2 * | 8/2008 | Ma et al. ............... | 361/56 |
| 7,411,767 B2 * | 8/2008 | Huang et al. ............... | 361/56 |
| 2005/0162791 A1 * | 7/2005 | Ahmad et al. ............... | 361/56 |
| 2008/0080108 A1 * | 4/2008 | Lin et al. ............... | 361/56 |
| 2008/0093672 A1 * | 4/2008 | Perng et al. ............... | 257/355 |

* cited by examiner

*Primary Examiner*—Ronald W Leja
(74) *Attorney, Agent, or Firm*—Quintero Law Office

(57) ABSTRACT

An electrostatic discharge (ESD) protection circuit is provided. A transistor is coupled between a node and a ground, and has a gate coupled to the ground. A diode chain is coupled between the node and a pad, and comprises a plurality of first diodes connected in series, wherein the first diode is coupled in a forward conduction direction from the pad to the node. A second diode is coupled between the node and the pad, and the second diode is coupled in a forward conduction direction from the node to the pad.

20 Claims, 1 Drawing Sheet

ELECTROSTATIC DISCHARGE PROTECTION CIRCUITS

BACKGROUND OF THE INVENTION

1. Field of the Invention

The invention relates to an electrostatic discharge (ESD) protection, and more particularly to an ESD protection of a high voltage pin for a low voltage process.

2. Description of the Related Art

Electrostatic discharge phenomenon will cause damage to semiconductor devices and affect normal functioning of integrate circuits (IC). Thus, it is necessary goal for IC designers during the design stage to enhance ESD protection of an IC to increase ESD sensitivity.

Recently, more and more ICs can operate with lower operating voltages, such as operating voltages of typical logic circuits, i.e. 5V, 3.3V, 2.5V and 1.8V etc., due to rapid advancement of low voltage (LV) manufacturing technology. However, for certain products which have particular application requirements, certain pins for an IC require operating at higher voltages, i.e. 7V, 8V, 9V and so on. Voltage substantially greater than 5V but not belonging to a typical high voltage (HV) range, is medium voltage (MV).

For ICs, malfunction will occur in LV devices when an MV is applied to the LV devices. In this situation, the LV device functions will be false since the LV ESD protection circuit is unable to protect pins operated at MV. Therefore, an MV ESD protection circuit for LV processes is needed.

BRIEF SUMMARY OF THE INVENTION

The invention discloses an electrostatic discharge (ESD) protection circuit comprising: a transistor coupled between a node and a ground, having a gate coupled to the ground; a diode chain coupled between the node and a pad, comprising a plurality of first diodes connected in series, and the first diode is coupled in a forward conduction direction from the pad to the node; and a second diode coupled between the node and the pad, and the second diode is coupled in a forward conduction direction from the node to the pad.

In addition, the invention discloses an electrostatic discharge (ESD) protection circuit comprising: an N-type transistor coupled between a node and a ground, having a gate coupled to the ground; a first diode having a first anode and a first cathode, the first anode is coupled to a pad; a second diode having a second anode and a second cathode, the second anode is coupled to the first cathode and the second cathode is coupled to the node; and a third diode having a third anode and a third cathode, the third anode is coupled to the node and the third cathode is coupled to the pad.

Moreover, the invention discloses an electrostatic discharge (ESD) protection circuit comprising: a transistor coupled between a node and a ground, having a gate coupled to the ground; a diode chain coupled between the node and a pad, comprising a plurality of first diodes connected in series; and a second diode coupled between the node and the pad. The first diode is conducted in a forward direction from the pad to the node when a first voltage of the pad is greater than a second voltage of the node, and the second diode is conducted in a forward direction from the node to the pad when the second voltage is greater than the first voltage.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
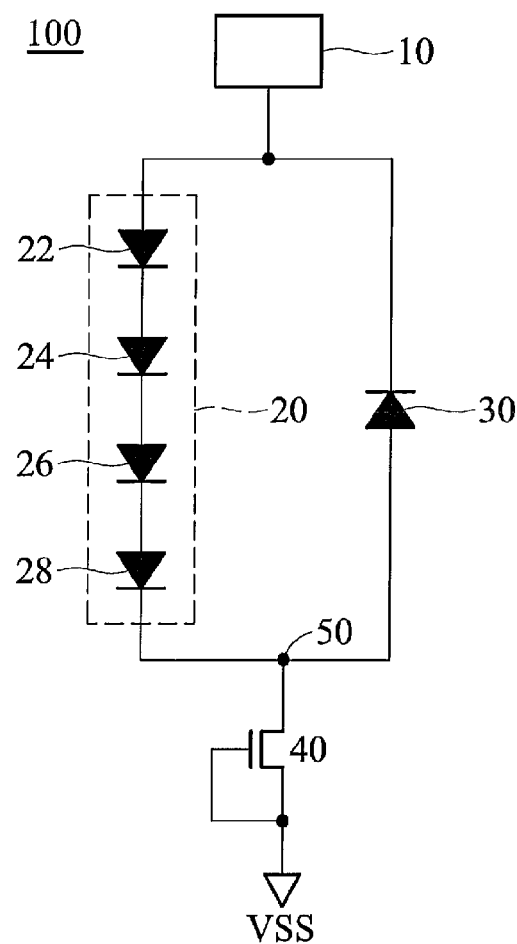
FIG. 1 an ESD protection circuit 100 according to an embodiment of the invention.

FIG. 1 shows an ESD protection circuit 100 according to an embodiment of the invention. The ESD protection circuit 100 comprises a pad 10, a diode chain 20, a diode 30, and a transistor 40. The pad 10 is coupled to a pin which receives a medium voltage signal. The diode chain 20 is composed of four diodes 22, 24, 26 and 28 connected in series, wherein an anode of the diode 22 is coupled to the pad 10, a cathode of the diode 22 is coupled to an anode of the diode 24, a cathode of the diode 24 is coupled to an anode of the diode 26, a cathode of the diode 26 is coupled to an anode of the diode 28, and a cathode of the diode 28 is coupled to a node 50. Thus, each diode of the diode chain 20 is coupled in a forward conduction direction from the pad 10 to the node 50. The diode 30 is coupled between the pad 10 and the node 50, and the diode 30 is coupled in a forward conduction direction from the node 50 to the pad 10, i.e. an anode of the diode 30 is coupled to the node 50 and a cathode of the diode 30 is coupled to the pad 10. The transistor 40 is coupled between the node 50 and a ground VSS, wherein a gate of the transistor 40 is coupled to the ground VSS. In this embodiment, the transistor 40 is an N-type metal oxide semiconductor (NMOS) transistor. The diodes of the diode chain 20 are conducted in a forward direction from the pad 10 to the node 50 when a voltage of the pad 10 is greater than a voltage of the node 50 during an ESD event. On the other hand, the diode 30 is conducted in a forward direction from the node 50 to the pad 10 when the voltage of the node 50 is greater than the voltage of the pad 10.

Figure 2:
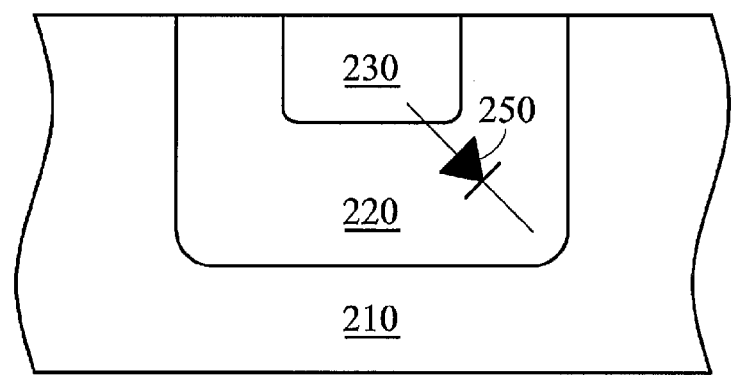
FIG. 2 shows a sectional view of a diode according to an embodiment of the invention.

FIG. 2 shows a sectional view of a diode according to an embodiment of the invention. As shown in FIG. 2, an N-well 220 is disposed in a P-substrate 210 and a P-type doped region 230 is disposed in the N-well 220, wherein a P-type diode 250 is formed with the P-type doped region 230 and the N-well 220. As shown in FIG. 2, the P-type diode 250 is surrounded with the N-well 220. Thus, the P-type diode 250 can be used to be stacked due to a breakdown voltage from the N-well 220 to the P-substrate 210 being higher. Therefore, in an embodiment of the invention, the diodes of the diode chain 20 and the diode 30 are the P-type diode 250.

Referring to FIG. 1, an amount of the diodes for the diode chain 20 is determined according to an operating voltage of the medium voltage signal and a breakdown voltage of the transistor 40. For typical logic circuits, common operating voltages are 5V, 3.3V, 2.5V and 1.8V etc. However, certain pins of logic circuits require operating at higher voltages, such as a voltage which is greater than 5V, i.e. medium voltage. For example, assume that the breakdown voltage of the transistor 40 is 8V and the operating voltage of the medium voltage signal is 9V. Then, if a guard band of ESD protection is 20%, a maximum voltage operated in the pad 10 is 10.8V. Then, a voltage difference between the maximum voltage of the pad 10 and the breakdown voltage of the transistor 40 is 2.8V. Thus, four diodes are needed for the diode chain 20 if the voltage difference is 2.8V, because a forward bias of a diode is about 0.7V. In this embodiment, the 9V medium voltage is intended to be illustrative, and not to limit the scope of the invention. Users can select a suitable amount of the diodes according to various medium voltages and breakdown voltage of low voltage devices.

The ESD protection circuit described in the embodiment of the invention can provide medium voltage ESD protection in low voltage circuits formed by low voltage processes. Furthermore, the ESD protection circuit described in the embodiment of the invention can provide ESD protection for higher voltages in present low voltage processes without additional manufacturing cost.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An electrostatic discharge (ESD) protection circuit, comprising:
    a transistor coupled between a node and a ground, having a gate coupled to the ground;
    a diode chain coupled between the node and a pad, comprising a plurality of first diodes connected in series, and the first diode is coupled in a forward conduction direction from the pad to the node; and
    a second diode coupled between the node and the pad, and the second diode is coupled in a forward conduction direction from the node to the pad.

2. The electrostatic discharge protection circuit as claimed in claim 1, wherein the transistor is an NMOS transistor.

3. The electrostatic discharge protection circuit as claimed in claim 1, wherein the first diode and the second diode are P-type diodes.

4. The electrostatic discharge protection circuit as claimed in claim 3, wherein the P-type diode comprises:
    an N-well disposed in a P-substrate; and
    a P-type doped region disposed in the N-well.

5. The electrostatic discharge protection circuit as claimed in claim 1, wherein the transistor, the diode chain and the second diode are implemented in a low voltage circuit formed by a low voltage process, and a first operating voltage of the low voltage circuit is lower than a first voltage value.

6. The electrostatic discharge protection circuit as claimed in claim 5, wherein the pad is coupled to a pin, and a second operating voltage of the pin exceeds the first voltage value.

7. The electrostatic discharge protection circuit as claimed in claim 6, wherein the first voltage value is about 5 volts.

8. The electrostatic discharge protection circuit as claimed in claim 6, wherein an amount of the first diodes is determined according to the second operating voltage and a breakdown voltage of the transistor.

9. An electrostatic discharge (ESD) protection circuit, comprising:
    an N-type transistor coupled between a node and a ground, having a gate coupled to the ground;
    a first diode having a first anode and a first cathode, the first anode is coupled to a pad;
    a second diode having a second anode and a second cathode, the second anode is coupled to the first cathode and the second cathode is coupled to the node; and
    a third diode having a third anode and a third cathode, the third anode is coupled to the node and the third cathode is coupled to the pad.

10. The electrostatic discharge protection circuit as claimed in claim 9, wherein the first diode, the second diode and the third diode are P-type diodes.

11. The electrostatic discharge protection circuit as claimed in claim 10, wherein the P-type diode comprises:
    an N-well disposed in a P-substrate; and
    a P-type doped region disposed in the N-well.

12. The electrostatic discharge protection circuit as claimed in claim 9, wherein the N-type transistor, the first, second and third diodes are implemented in a low voltage circuit formed by a low voltage process, and a first operating voltage of the low voltage circuit is lower than a first voltage value.

13. The electrostatic discharge protection circuit as claimed in claim 12, wherein the pad is coupled to a pin, and a second operating voltage of the pin exceeds the first voltage value.

14. An electrostatic discharge (ESD) protection circuit, comprising:
    a transistor coupled between a node and a ground, having a gate coupled to the ground;
    a diode chain coupled between the node and a pad, comprising a plurality of first diodes connected in series; and
    a second diode coupled between the node and the pad, wherein the first diode is conducted in a forward direction from the pad to the node when a first voltage of the pad is greater than a second voltage of the node, and the second diode is conducted in a forward direction from the node to the pad when the second voltage is greater than the first voltage.

15. The electrostatic discharge protection circuit as claimed in claim 14, wherein the transistor is an NMOS transistor.

16. The electrostatic discharge protection circuit as claimed in claim 14, the first diode and the second diode are P-type diodes.

17. The electrostatic discharge protection circuit as claimed in claim 16, wherein the P-type diode comprises:
    an N-well disposed in a P-substrate; and
    a P-type doped region disposed in the N-well.

18. The electrostatic discharge protection circuit as claimed in claim 14, wherein the transistor, the diode chain and the second diode are implemented in a low voltage circuit formed by a low voltage process, and a first operating voltage of the low voltage circuit is lower than 5 volts.

19. The electrostatic discharge protection circuit as claimed in claim 18, wherein the pad is coupled to a pin, and a second operating voltage of the pin is greater than 5 volts.

20. The electrostatic discharge protection circuit as claimed in claim 19, wherein an amount of the first diodes is determined according to the second operating voltage and a breakdown voltage of the transistor.

* * * * *